United States Patent
Sato et al.

(10) Patent No.: US 9,444,040 B2
(45) Date of Patent: Sep. 13, 2016

(54) SIDEWALL TYPE MEMORY CELL

(71) Applicant: Microchip Technology Incorporated, Chandler, AZ (US)

(72) Inventors: Justin Hiroki Sato, West Linn, OR (US); Bomy Chen, Newark, CA (US); Sonu Daryanani, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/183,831

(22) Filed: Feb. 19, 2014

(65) Prior Publication Data
US 2014/0264248 A1    Sep. 18, 2014

Related U.S. Application Data

(60) Provisional application No. 61/780,249, filed on Mar. 13, 2013.

(51) Int. Cl.
*H01L 47/00* (2006.01)
*H01L 45/00* (2006.01)

(52) U.S. Cl.
CPC ......... *H01L 45/085* (2013.01); *H01L 45/1226* (2013.01); *H01L 45/1273* (2013.01); *H01L 45/1675* (2013.01)

(58) Field of Classification Search
None
See application file for complete search history.

(56) References Cited

U.S. PATENT DOCUMENTS

| | | | |
|---|---|---|---|
| 5,790,455 A | 8/1998 | Caywood | 635/185.06 |
| 5,962,872 A | 10/1999 | Zhang et al. | 257/66 |
| 5,986,931 A | 11/1999 | Caywood | 365/185.06 |
| 6,031,287 A | 2/2000 | Harshfield | 257/734 |
| 6,147,395 A | 11/2000 | Gilgen | 257/529 |
| 6,436,611 B1 | 8/2002 | Lee | 430/314 |
| 2002/0036931 A1 | 3/2002 | Lowrey et al. | 365/200 |
| 2002/0039306 A1 | 4/2002 | Lowrey | 365/100 |
| 2004/0192009 A1 | 9/2004 | Belyansky et al. | 438/424 |

(Continued)

FOREIGN PATENT DOCUMENTS

| | | | |
|---|---|---|---|
| CN | 102130145 A | 7/2011 | H01L 27/24 |
| DE | 102007049786 A1 | 4/2009 | H01L 27/24 |

(Continued)

OTHER PUBLICATIONS

International Search Report and Written Opinion, Application No. PCT/US2014/019868, 10 pages, Jun. 5, 2014.

(Continued)

*Primary Examiner* — Evan Pert
*Assistant Examiner* — Shaka White
(74) *Attorney, Agent, or Firm* — Slayden Grubert Beard PLLC (57) ABSTRACT

A sidewall-type memory cell (e.g., a CBRAM, ReRAM, or PCM cell) may include a bottom electrode, a top electrode layer defining a sidewall, and an electrolyte layer arranged between the bottom and top electrode layers, such that a conductive path is defined between the bottom electrode and a the top electrode sidewall via the electrolyte layer, wherein the bottom electrode layer extends generally horizontally with respect to a horizontal substrate, and the top electrode sidewall extends non-horizontally with respect to the horizontal substrate, such that when a positive bias-voltage is applied to the cell, a conductive path grows in a non-vertical direction (e.g., a generally horizontal direction or other non-vertical direction) between the bottom electrode and the top electrode sidewall.

24 Claims, 12 Drawing Sheets

(56) References Cited

U.S. PATENT DOCUMENTS

| | | |
|---|---|---|
| 2005/0029505 A1 | 2/2005 | Lowrey ........................ 257/5 |
| 2006/0006443 A1 | 1/2006 | Lowrey et al. .............. 257/296 |
| 2006/0097238 A1 | 5/2006 | Breuil et al. ..................... 257/4 |
| 2007/0097738 A1* | 5/2007 | Asano et al. ................ 365/163 |
| 2007/0267618 A1 | 11/2007 | Zaidi et al. ..................... 257/2 |
| 2008/0012079 A1 | 1/2008 | Zaidi ........................... 257/379 |
| 2009/0017591 A1 | 1/2009 | Cervin-Lawry et al. ..... 438/384 |
| 2009/0026438 A1 | 1/2009 | Lin ................................... 257/4 |
| 2009/0096568 A1 | 4/2009 | Hosoi et al. .................... 338/20 |
| 2009/0200640 A1 | 8/2009 | Hosoi et al. .................. 257/536 |
| 2010/0019218 A1 | 1/2010 | Chung .............................. 257/4 |
| 2010/0084741 A1* | 4/2010 | Andres et al. ................ 257/536 |
| 2010/0163829 A1 | 7/2010 | Wang et al. ..................... 257/3 |
| 2010/0193762 A1 | 8/2010 | Hsieh et al. ..................... 257/4 |
| 2010/0252798 A1 | 10/2010 | Sumino ......................... 206/503 |
| 2010/0264396 A1 | 10/2010 | Lung et al. ...................... 257/3 |
| 2011/0147694 A1* | 6/2011 | Song .................... H01L 27/101 257/3 |
| 2011/0180775 A1 | 7/2011 | Lin et al. ......................... 257/4 |
| 2011/0291064 A1 | 12/2011 | Marsh et al. .................... 257/4 |
| 2012/0294065 A1 | 11/2012 | Hong et al. ................... 365/148 |
| 2012/0313071 A1* | 12/2012 | Gopalan .......................... 257/4 |
| 2012/0319072 A1 | 12/2012 | Wei et al. ........................ 257/4 |
| 2013/0001501 A1 | 1/2013 | Sills ................................. 257/4 |
| 2013/0112936 A1 | 5/2013 | Wei et al. ........................ 257/4 |
| 2013/0214234 A1 | 8/2013 | Gopalan et al. ................. 257/3 |
| 2013/0252431 A1 | 9/2013 | Chen et al. .................... 438/702 |
| 2013/0336046 A1 | 12/2013 | Oh ................................. 365/163 |
| 2014/0264245 A1 | 9/2014 | Walls ............................... 257/4 |
| 2015/0236255 A1 | 8/2015 | Fest et al. ........................ 257/3 |
| 2015/0236258 A1 | 8/2015 | Fest et al. ........................ 257/3 |

FOREIGN PATENT DOCUMENTS

| | | | |
|---|---|---|---|
| EP | 1355365 A2 | 10/2003 | ............ H01L 27/10 |
| EP | 2202816 A1 | 6/2010 | ............ H01L 27/24 |
| EP | 2267775 A2 | 12/2010 | |
| EP | 2339585 A1 | 6/2011 | |
| WO | 2012/057772 A1 | 5/2012 | ........ H01L 21/8247 |
| WO | 2012/167286 A1 | 12/2012 | ............ G11C 11/34 |
| WO | 2014/164015 A1 | 10/2014 | ............ H01L 45/00 |

OTHER PUBLICATIONS

International Search Report and Written Opinion, Application No. PCT/US2014/019906, 12 pages, Jul. 2, 2014.

Kozicki, M., "Nanoscale Memory Elements Based on Solid-State Electrolytes," IEEE Transactions on Nano Technology, vol. 4, No. 3, 8 pages, May 2005.

Chen, A., "Non-Volatile Resistive Switching for Advanced Memory Applications," IEDM Technical Digest, 4 pages, 2005.

Balakrishnan, M. et al., "A Low Power Non-Volatile Memory Element Based on Copper in Deposited Silicon Oxide," Non-Volatile Memory Technology Symposium, 7 pages, 2006.

Schindler, C. et al., "Bipolar and Unipolar Resistive Switching in CU-Doped SiO2," IEEE Transactions on Electron Devices, vol. 54, No. 10, 7 pages, 2007.

Chen, A., "Ionic Memories: Status and Challenges," Non-Volatile Memory Technology Symposium, 5 pages, 2008.

Valov, I. et al., "Electrochemical Metallization Memories - Fundamentals, Applications, Prospects," Nanotechnology, vol. 22, No. 25, 22 pages, Jun. 24, 2011.

Jou, S. et al., "Resistance Switching Properties in Cu/Cu-SiO2/TaN Device," Proceeding World Congress on Engineering, vol. 2, 4 pages, Jul. 6, 2011.

Yang, L. et al., "Linear Scaling of Reset Current Down to 22-nm Node for a Novel CuxSiyO RRAM," IEEE Electron Device Letters, vol. 33, No. 1, 3 pages, 2012.

International Search Report and Written Opinion, Application No. PCT/US2015/016268, 9 pages, May 4, 2015.

International Search Report and Written Opinion, Application No. PCT/US2014/020188, 10 pages, May 13, 2014.

International Search Report and Written Opinion, Application No. PCT/US2014/022194, 11 pages, May 16, 2014.

U.S. Final Office Action, U.S. Appl. No. 14/184,034, 29 pages, Dec. 16, 2015.

U.S. Final Office Action, U.S. Appl. No. 14/184,331, 10 pages, Nov. 12, 2015.

U.S. Non-Final Office Action, U.S. Appl. No. 14/184,177, 12 pages, Jun. 19, 2015.

U.S. Non-Final Office Action, U.S. Appl. No. 14/183,792, 23 pages, Jul. 8, 2015.

U.S. Non-Final Office Action, U.S. Appl. No. 14/183,674, 26 pages, Jul. 8, 2015.

U.S. Non-Final Office Action, U.S. Appl. No. 14/183,738, 26 pages, Jul. 16, 2015.

U.S. Non-Final Office Action, U.S. Appl. No. 14/183,953, 27 pages Jul. 31, 2015.

International Search Report and Written Opinion, Application No. PCT/US2015/016321, 11 pages, Jul. 14, 2015.

International Search Report and Written Opinion, Application No. PCT/US2015/016259, 16 pages, May 6, 2015.

International Search Report and Written Opinion, Application No. PCT/US2015/016244, 11 pages, May 7, 2015.

International Search Report and Written Opinion, Application No. PCT/US2015/016334, 11 pages, Dec. 7, 2015.

International Search Report and Written Opinion, Application No. PCT/US2015/062758, 12 pages, Mar. 2, 2016.

U.S. Non-Final Office Action, U.S. Appl. No. 14/184,034, 20 pages (Jul. 5, 2016).

* cited by examiner

SIDEWALL TYPE MEMORY CELL

CROSS-REFERENCE TO RELATED APPLICATIONS

This application claims the benefit of U.S. Provisional Application No. 61/780,249 filed on Mar. 13, 2013, which is incorporated herein in its entirety.

TECHNICAL FIELD

The present disclosure relates to programmable memory cells, e.g., to non-volatile memory cells (e.g., bridging random access (CBRAM) memory cells, oxygen vacancy based Resistive RAM (ReRAM) cells, and phase-changing memory (PCM) cells) having a sidewall-type configuration.

BACKGROUND

Resistive memory cells, such as conductive bridging memory (CBRAM) and resistive RAM (ReRAM) cells are a new type of non-volatile memory cells that provide scaling and cost advantages over conventional Flash memory cells. A CBRAM is based on the physical re-location of ions within a solid electrolyte. A CBRAM memory cell can be made of two solid metal electrodes, one relatively inert (e.g., tungsten) the other electrochemically active (e.g., silver or copper), separated from each other by a thin layer or film of non-conducting material. The CBRAM cell generates programmable conducting filaments across the non-conducting film through the application of a bias voltage across the non-conducting film. The conducting filaments may be formed by single or very few nanometer-scale ions. The non-conducting film may be referred to as an electrolyte because it provides for the propagation of the conductive filament(s) across the film through an oxidation/reduction process much like in a battery. In a ReRAM cell, the conduction occurs through creation of a vacancy chain in an insulator. The generation of the conductive filament(s)/vacancy-chain(s) creates an on-state (high conduction between the electrodes), while the dissolution of the conductive filament(s)/vacancy-chain(s), e.g., by applying a similar polarity with Joule heating current or an opposite polarity but at smaller currents, reverts the electrolyte/insulator back to its nonconductive off-state. In this disclosure both the electrolyte film, layer, or region of a CBRAM cell and the insulator film, layer, or region of a ReRAM cell are referred to as an "electrolyte," for the sake of simplicity.

A wide range of materials have been demonstrated for possible use in resistive memory cells, both for the electrolyte and the electrodes. One example is the Cu/SiOx based cell in which the Cu is the active metal-source electrode and the SiOx is the electrolyte.

One common problem facing resistive memory cells is the on-state retention, i.e., the ability of the conductive path (filament or vacancy chain) to be stable, especially at the elevated temperatures that the memory parts may typically be qualified to (e.g., 85 C/125 C).

Figure 1:
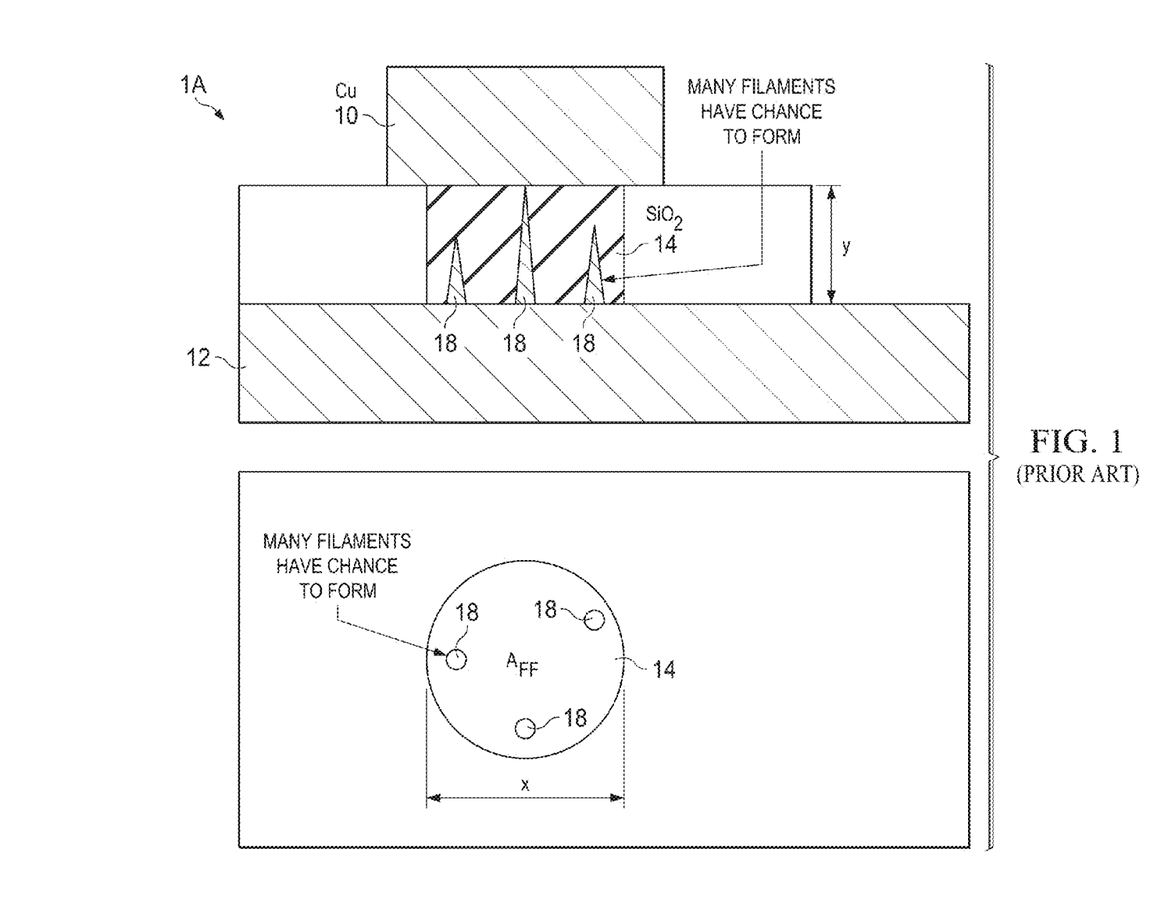
FIG. 1 shows an example conventional CBRAM cell.

FIG. 1 shows a conventional CBRAM cell 1A, having a top electrode 10 (e.g., copper) arranged over a bottom electrode 12 (e.g., tungsten), with the electrolyte or middle electrode 14 (e.g., $SiO_2$) arranged between the top and bottom electrodes. Conductive filaments 18 propagate from the bottom electrode 12 to the top electrode 10 through the electrolyte 14 when a bias voltage is applied to the cell 1A. This structure has various potential limitations or drawbacks. For example, the effective cross-sectional area for filament formation, which may be referred to as the "confinement zone" or the "filament formation area" indicated as $A_{FF}$, is relatively large and unconfined, making the filament formation area susceptible to extrinsic defects. Also, multi-filament root formation may be likely, due to a relatively large area, which may lead to weaker (less robust) filaments. In general, the larger the ratio between the diameter or width of the filament formation area $A_{FF}$ (indicated by "x") to the filament propagation distance from the bottom electrode 12 to the top electrode 10 (in this case, the thickness of the electrolyte 14, indicated by "y"), the greater the chance of multi-root filament formation. Further, a large electrolyte volume surrounds the filament, which provides diffusion paths for the filament and thus may provide poor retention. Thus, restricting the volume of the electrolyte material in which the conductive path forms may provide a more robust filament due to spatial confinement. The volume of the electrolyte material in which the conductive path forms may be restricted by reducing the area in contact between the bottom electrode 12 and the electrolyte 14.

As used herein, "conductive path" refers a conductive filament (e.g., in a CBRAM cell), vacancy chain (e.g., in an oxygen vacancy based ReRAM cell), or any other type of conductive path for connecting the electrodes of a non-volatile memory cell, typically through an electrolyte layer or region arranged between the electrodes. As used herein the "electrolyte layer" or "electrolyte region" refers to an electrolyte/insulator/memory layer or region between the bottom and top electrodes through which the conductive path propagates.

Figure 2:
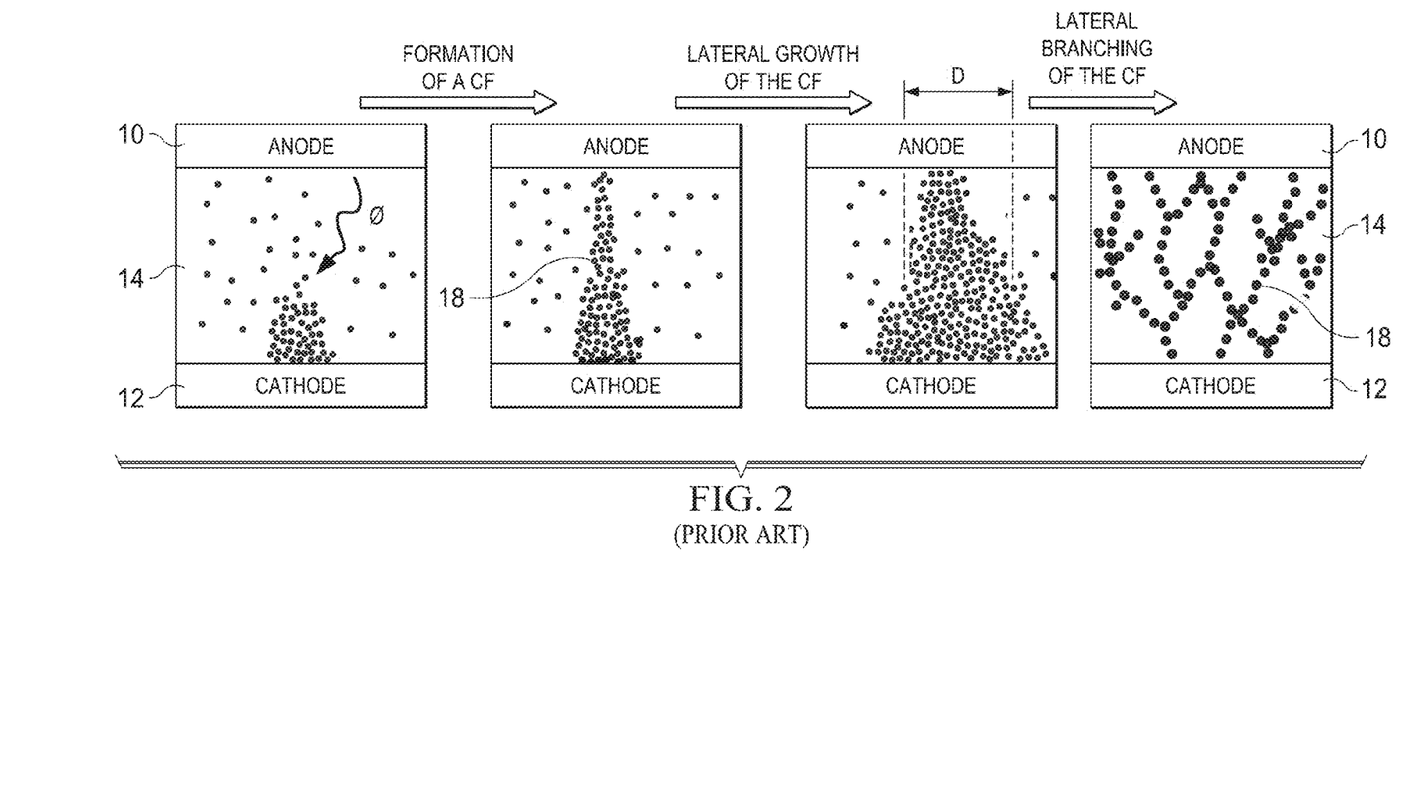
FIG. 2 shows certain principles of CBRAM cell formation.

FIG. 2 shows certain principles of a CBRAM cell formation. Conductive paths 18 may form and grow laterally, or branch into multiple parallel paths. Further, locations of the conductive paths may change with each program/erase cycle. This may contribute to marginal switching performance, variability, high-temp retention issues, and/or poor switching endurance. Restricting switching volume has been shown to benefit the operation. These principles apply equally to ReRAM and CBRAM cells. A key obstacle for adoption of these technologies is switching uniformity.

Figure 3A:
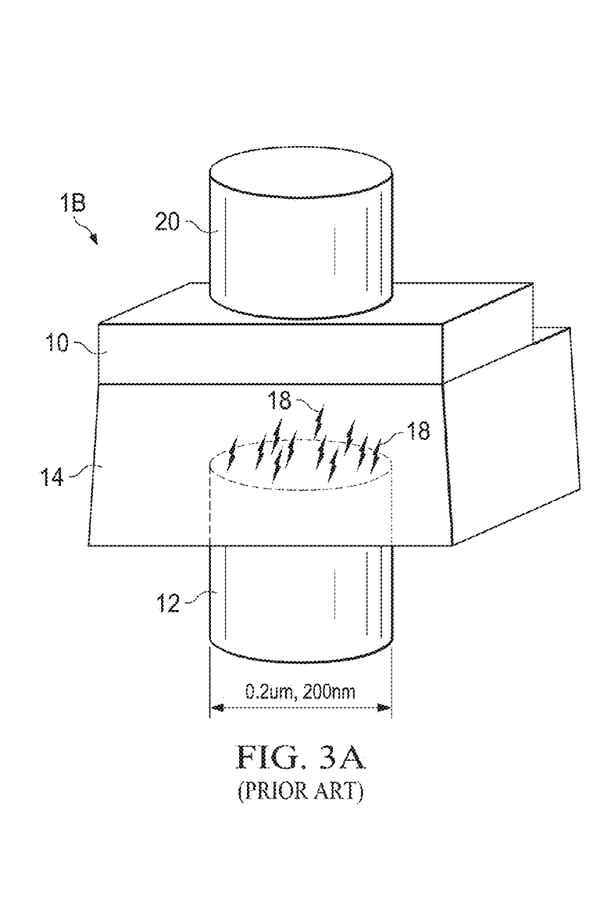
FIGS. 3A and 3B show a schematic view and an electron microscope image of an example known CBRAM cell configuration.
Figure 3B:
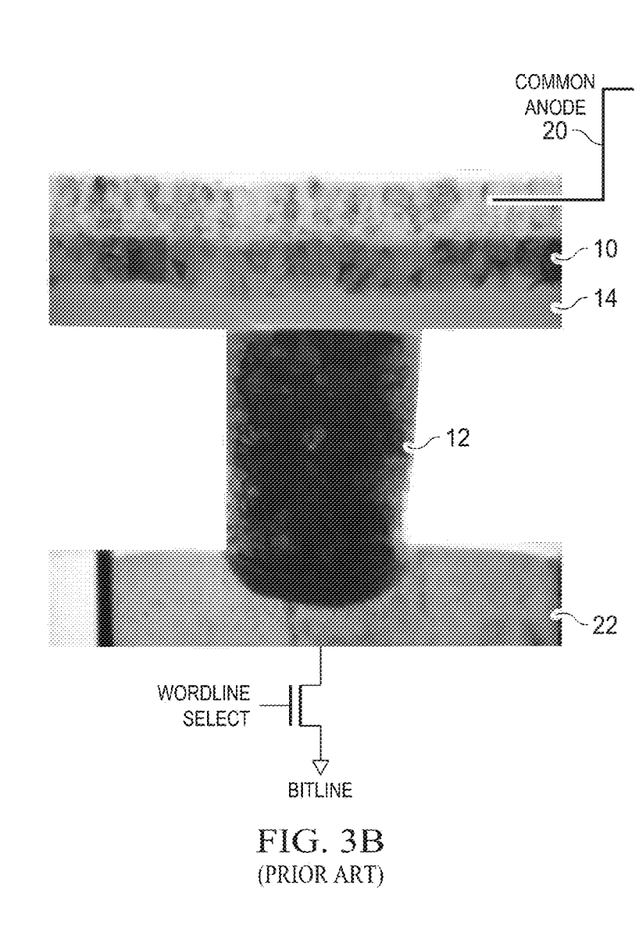

FIGS. 3A and 3B show a schematic view and an electron microscope image of an example known bottom electrode configuration 1B for a CBRAM cell (e.g., having a one-transistor, one-resistive memory element (1T1R) architecture). In this example, the bottom electrode 12 is a cylindrical via, e.g., a tungsten-filled via with a Ti/TiN liner. A top contact and/or anode 20 may be connected to the top electrode 10 as shown. The bottom electrode 12 may provide a relatively large filament formation area $A_{FF}$ of about 30,000 $nm^2$, for example, which may lead to one or more of the problems or disadvantages discussed above.

SUMMARY

Some embodiments provide memory cells, e.g., CBRAM, ReRAM, or PCM cells, and methods of forming such memory cells, having a sloped or top electrode sidewall extending non-horizontally (e.g., vertically or otherwise non-horizontally) proximate a horizontally extending bottom electrode, with an electrolyte arranged between and defining a conductive path for filament formation between the horizontally extending bottom electrode and non-horizontally extending top electrode sidewall. In some embodiments, the top electrode sidewall may have a ring shape extending around an outer perimeter of the bottom electrode. This arrangement may provide a reduced filament formation area $A_{FF}$, as compared with conventional horizontally stacked electrode-electrolyte-electrode memory cell structures.

According to one embodiment, a sidewall-type memory cell (e.g., a CBRAM, ReRAM, or PCM cell) comprises a bottom electrode, a top electrode layer defining a sidewall, and an electrolyte layer arranged between the bottom and top electrode layers, such that a conductive path is defined between the bottom electrode and a the top electrode sidewall via the electrolyte layer, wherein the bottom electrode layer extends generally horizontally with respect to a horizontal substrate, and the top electrode sidewall extends non-horizontally with respect to the horizontal substrate, such that when a positive bias-voltage is applied to the cell, a conductive path grows in a non-vertical direction (e.g., a generally horizontal direction or other non-vertical direction) between the bottom electrode and the top electrode sidewall.

According to another embodiment, a method of forming a sidewall-type resistive memory cell comprises depositing a bottom electrode layer over a horizontally extending substrate, forming a mask layer over the bottom electrode layer, patterning the bottom electrode layer and the mask layer to define a bottom electrode and mask region, depositing an electrolyte layer, and forming a top electrode such that a sidewall of the top electrode extends non-horizontally with respect to the horizontal substrate, with the electrode layer arranged between the bottom electrode and the top electrode layer sidewall.

BRIEF DESCRIPTION OF THE FIGURES

Example embodiments are discussed below with reference to the drawings, in which.

DESCRIPTION

According to various embodiments, a novel non-volatile memory (NVM) structure may define an electrode-electrolyte-electrode arrangement in a "sidewall" of the structure, as opposed to the conventional stack of horizontally-extending electrode and electrolyte layers shown in FIGS. 1-3. In some embodiments, the bottom (or inner) electrode is arranged horizontally, while the electrolyte switching layer and the top (or outer) electrode extend vertical, nearly vertically, or otherwise angled with respect to the horizontal plane of the bottom/inner electrode. Such memory cells is referred to herein as a sidewall-type memory cells, and such switching layer and top electrode are referred to herein as a sidewall-type switching layer and sidewall-type top/outer electrode. The disclosed sidewall-type memory cells may be embodied for example as metal filament based Conductive Bridge RAM (CBRAM) cells, oxygen vacancy based Resistive RAM (ReRAM) cells, phase-changing memory (PCM) cells, or any other suitable type of memory cell.

Figure 4A:
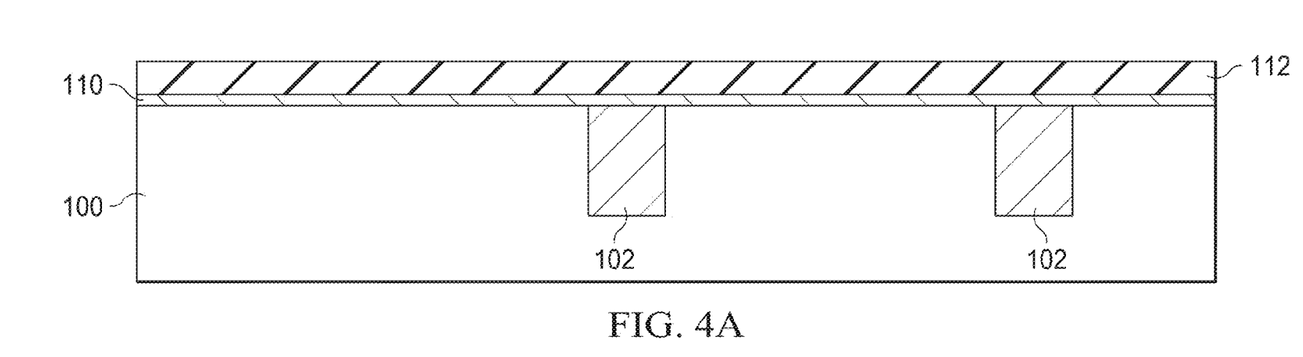
FIGS. 4A-4C show an example process for forming the bottom (or inner) electrode, electrolyte switching layer, and top (or outer) electrodes of a sidewall-type memory cell, which may be embodied as a CBRAM or ReRAM cell, for example, according to one embodiment.
Figure 4B:
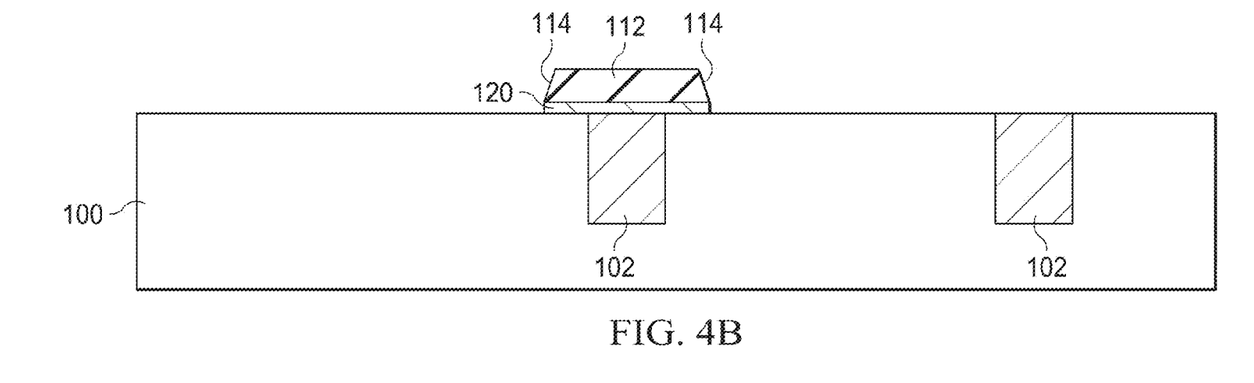
Figure 4C:
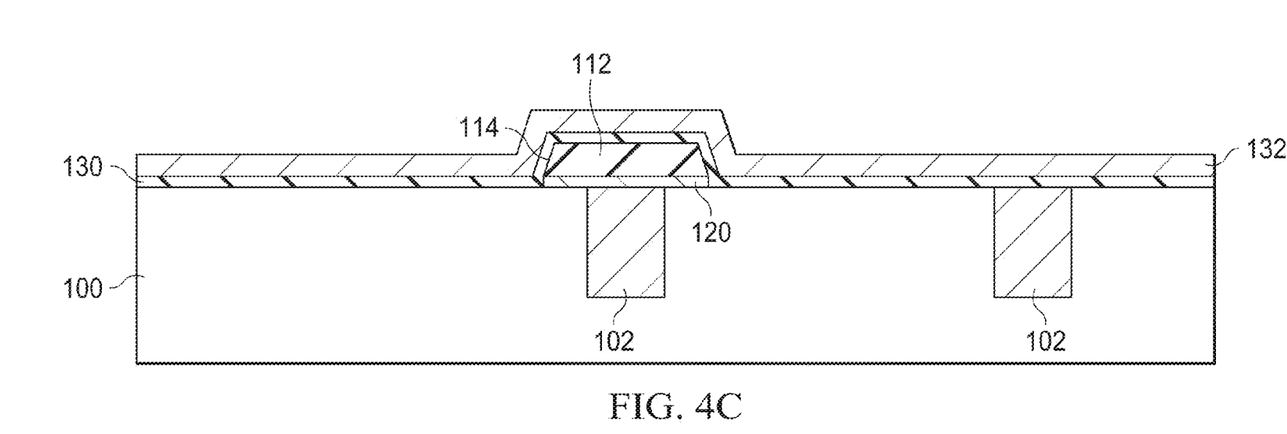

FIGS. 4A-4C show an example process for forming the bottom (or inner) electrode, electrolyte switching layer, and top (or outer) electrodes of a sidewall-type memory cell, which may be embodied as a CBRAM or ReRAM cell, for example, according to one embodiment. In a conventional memory cell structure, the electrodes are referred to as the bottom and top electrodes due to the horizontal arrangement of both electrodes and the intervening electrolyte switching layer. In a sidewall-type structure as disclosed herein, the conventional "bottom" and "top" electrodes may be viewed as "inner" and "outer" electrodes due to their respective arrangement. However, for the sake of simplicity such electrodes are referred to herein as the "bottom" and "top" electrodes of the sidewall-type structure, regardless of their relative arrangement. Thus, it should be clear that the "top" electrode may not be located above the "bottom" electrode, but rather may be located outside of, adjacent to, or otherwise located relative to, the bottom electrode.

As shown in FIG. 4A, one or more bottom electrode contacts 102 may be formed in a substrate 100. Bottom electrode contacts 102 are substrate 100 may be formed in any suitable manner (e.g., using conventional semiconductor fabrication techniques) and from any suitable materials. For example, substrate 100 may be formed from an insulator or dielectric, e.g., $SiO_2$, and bottom electrode contacts 102 may be formed from copper (Cu), tungsten (W), or other suitable material. In this example, each bottom electrode contact 102 is formed with a circular via-type shape. However, each bottom electrode contact 102 may be formed with any other suitable shape, e.g., an elongated line or elongated rectangular shape, a square shape, etc. Bottom electrode contacts 102 may connect the device to a control gate.

A bottom electrode (or cathode) layer 110 and a hard mask 112 may then be deposited or formed over the substrate 100 and bottom electrode connectors 102. Bottom electrode layer 110 may comprise any suitable conductive material or materials, e.g., polysilicon, doped polysilicon, amorphous silicon, doped amorphous silicon, or any other suitable material, and may be deposited or formed in any suitable manner. Hard mask layer 112 may be formed from any suitable materials (e.g., SiN, SiON, TEOS silicon oxide, or other dielectric material) and may be deposited or formed in any suitable manner as known in the art.

Next, as shown in FIG. 4B, the stack is then patterned and etched as shown. In particular, bottom electrode layer 110 and hard mask 112 may be etched to define one or more bottom electrodes 120 and sidewall(s) 114 in the remaining hard mask 112 and/or bottom electrode(s) 120, located above or near one or more underlying bottom electrode connectors 102. In other words, each bottom electrodes 120 is defined by a remaining portion of bottom electrode layer 110 after the etch process. The hard mask 112 may be etched to provide a predetermined sidewall angle. For example, the sidewall angle may be between 0 and 90 degrees (non-inclusive) relative to the plane of the substrate/wafer. In some embodiments, the sidewall angle is between 30 and 90 degrees (non-inclusive) relative to the plane of the substrate/wafer. In some embodiments, the sidewall angle is between 45 and 90 degrees (non-inclusive) relative to the plane of the substrate/wafer. In some embodiments, the sidewall angle is between 60 and 90 degrees (non-inclusive) relative to the plane of the substrate/wafer. In some embodiments, the sidewall angle is between 30 and 85 degrees (non-inclusive) relative to the plane of the substrate/wafer. In some embodiments, the sidewall angle is between 45 and 85 degrees (non-inclusive) relative to the plane of the substrate/wafer. In some embodiments, the sidewall angle is between 60 and 85 degrees (non-inclusive) relative to the plane of the substrate/wafer. In other embodiments, the sidewall angle is 90 degrees relative to the plane of the substrate/wafer.

Next, as shown in FIG. 4C, an electrolyte layer (e.g., non-volatile memory (NVM) film) 130 and a top electrode (anode) layer 132 are formed over the stack, and in particular, over each bottom electrode 120. Electrolyte layer 150 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Cu_xO_y$, $Al_2O_3$, or any other suitable material. Top electrode layer 152 may comprise any suitable conductive material or materials, e.g., Ag, Al, Cu, Ta, TaN, Ti, TiN, Al, W or any other suitable material, and may be deposited or formed in any suitable manner.

Figure 5:
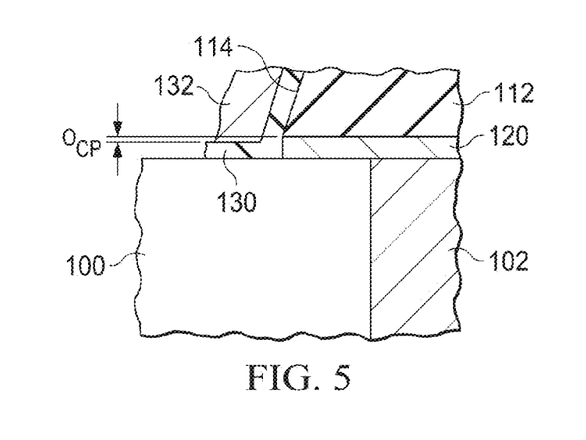
FIG. 5 is a close-up view of an example memory cell structure formed as disclosed herein, to illustrate the effective filament formation area, or conductive path volume, according to some embodiments.

FIG. 5 is a close-up view of portions of an example memory cell structure formed according to the method of FIGS. 4A-4C, according to one embodiment. As shown in FIG. 5, the thickness of the electrolyte layer 130 may be less than the thickness of the bottom electrode 120, such that a filament-formation conductive path—defined by the shortest path from the bottom electrode 120 to the top electrode 132—is defined at the vertical-direction overlap, indicated by $O_{CP}$, between the electrolyte layer 130 and bottom electrode 120 film thicknesses.

Decreasing the overlap $O_{CP}$ between the films decreases the conductive path formation volume, thus increasing the intrinsic nature of the electrode. The decrease in the conductive path formation volume may create a more robust conductive path and a repeatable program/erase method, because a single root conductive path can be formed as compared to a wider or branched path through a larger volume of electrode material. Retention may improve as well due to a smaller diffusion path for the conductive path.

A predetermined and/or uniform vertical-direction conductive path overlap $O_{CP}$ (i.e., the difference between the respective thicknesses of bottom electrode 120 and electrolyte layer 130) by forming layers 120 and 130 using methods that provide uniform layer thicknesses. For example, in some embodiments, layers 120 and 130 are formed by physical vapor deposition (PVD) processes.

In some embodiments, the vertical-direction conductive path overlap $O_{CP}$ (i.e., the difference between the respective thicknesses of bottom electrode 120 and electrolyte layer 130), is between 0 and 750 A. In some embodiments, the vertical-direction conductive path overlap $O_{CP}$, is between 20 and 150. In one particular embodiment, bottom electrode 120 has a thickness of 400 A+/−30 A, and electrolyte layer 130 has a thickness of 300 A+/−20 A, thus providing a conductive path overlap $O_{CP}$ of 100 A+/−35 A. A conductive path overlap $O_{CP}$ of 100 A may provide a reduction in the effective filament formation area $A_{FF}$ of about 50% to 99% as compared with conventional horizontally-stacked electrode-electrolyte-electrode cell structures.

FIGS. 6A-6C and 7A-7B illustrate two example embodiments for patterning the top electrode layer 132 and forming a top metal contact.

Figure 6A:
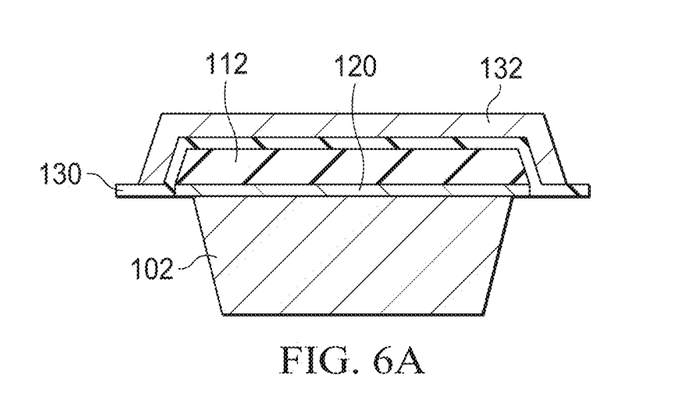
FIGS. 6A-6D illustrate a technique for patterning a top electrode layer and forming a top metal contact for a sidewall-type memory cell, according to one example embodiment.
Figure 6B:
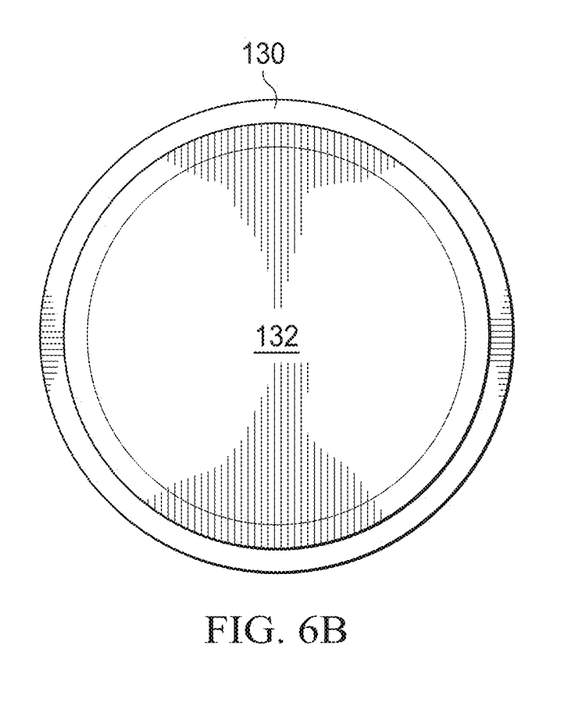
Figure 6C:
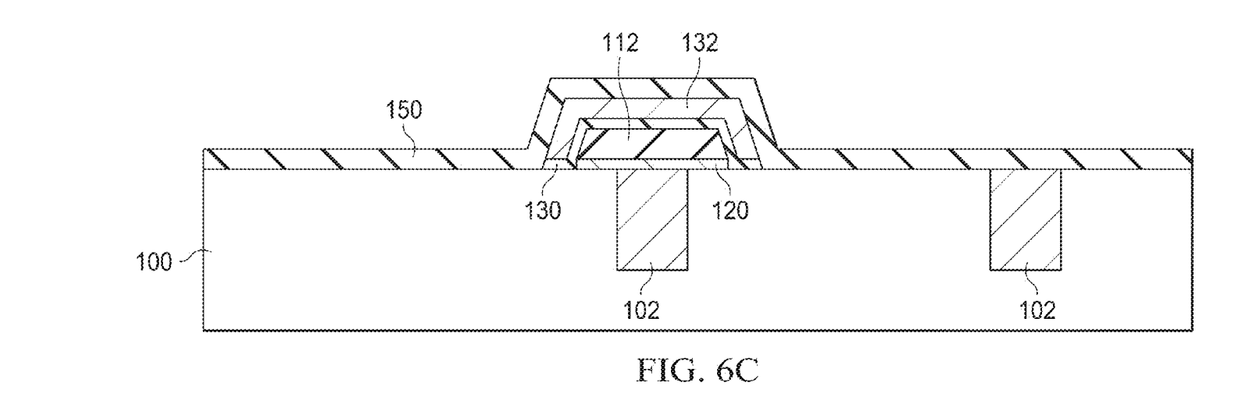
Figure 6D:
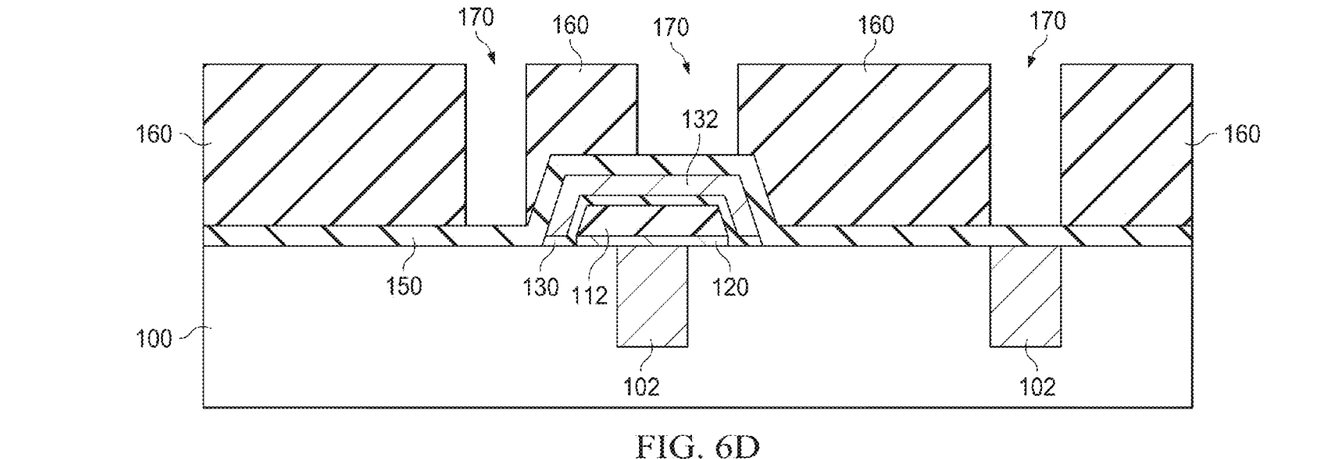

The example embodiment shown in FIGS. 6A-6C is explained as follows. As shown in FIGS. 6A (cross-sectional side view) and 6B (top view), the wafer is patterned with a photoresist to a critical dimension larger than the bottom electrode 120 critical dimension. The top electrode layer 132 and electrolyte film 130 are etched leaving a top electrode 132 and electrolyte switching region 130 covering the hard mask 112 and bottom electrode 120. The shortest path from the bottom electrode 120 through the electrolyte 130 to the top electrode 132 is defined at the top corners of the bottom electrode 120, e.g., as discussed above regarding FIG. 5. As shown in FIG. 6C, a barrier dielectric 150 may then be deposited to seal and protect the electrodes 120 and 132 and electrolyte 130. Next, as shown in FIG. 6D, an insulator layer 160 may be deposited and any suitable type(s) of electrical connections, e.g., via(s) 170, may be then etched into the insulator layer 160 to connect to the top electrode 132 to complete the circuit.

Figure 7A:
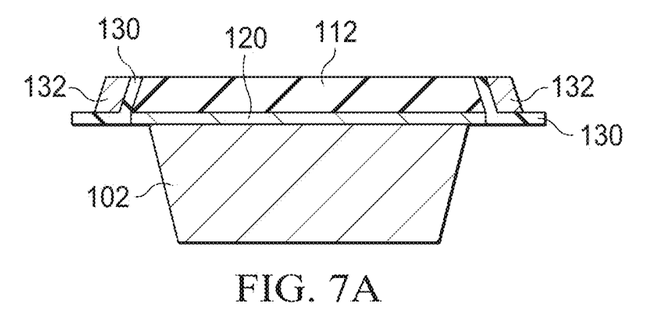
FIGS. 7A-7C illustrate another technique for patterning a top electrode layer and forming a top metal contact for a sidewall-type memory cell, according to another example embodiment.
Figure 7B:
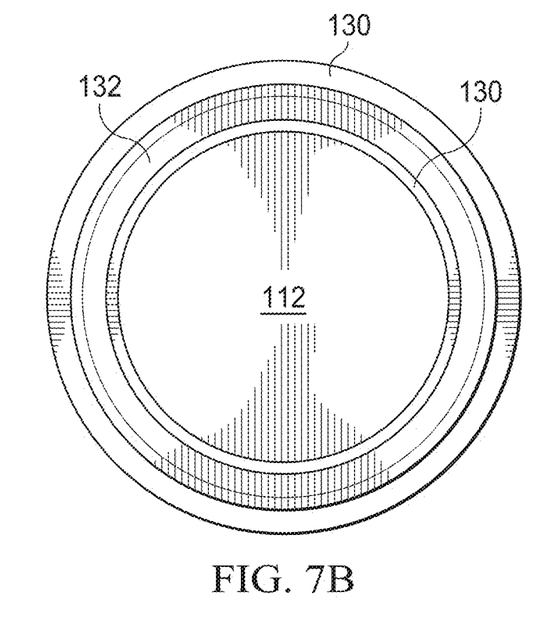
Figure 7C:
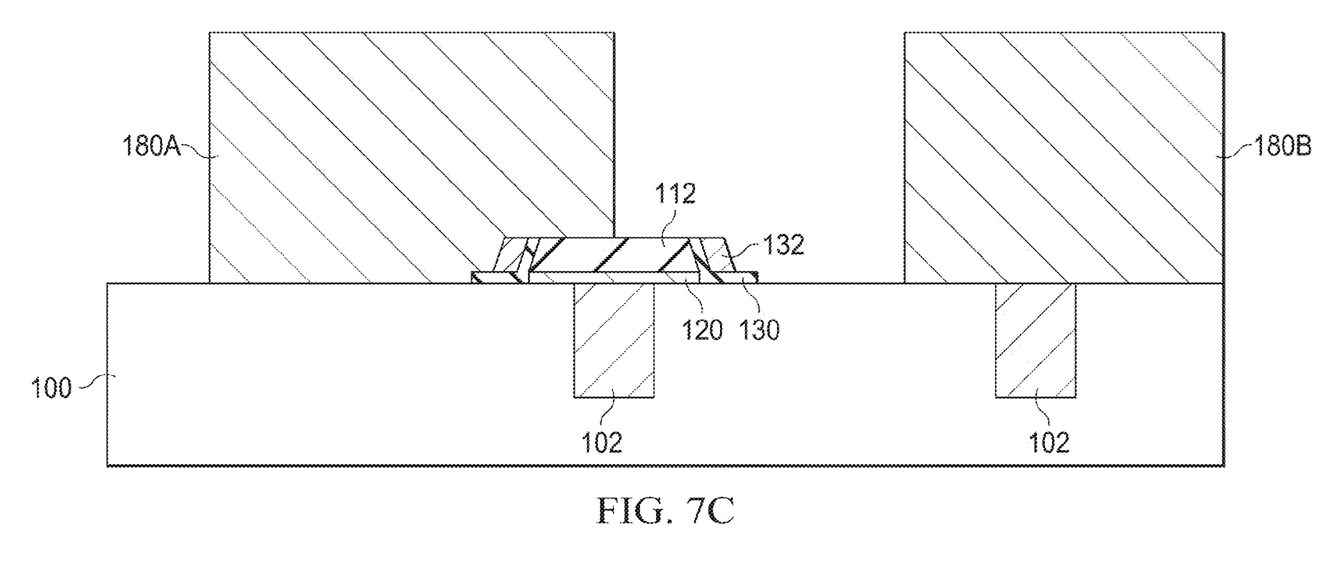

The example embodiment shown in FIGS. 7A-7B (single mask CBRAM/ReRAM formation process) is explained as follows. As shown in FIGS. 7A and 7B, after forming a sidewall-type cell structure as shown in FIG. 6A, top portions of the electrode 132 and electrolyte region 130 are removed to clear the top of the underlying hard mask 112 of electrode/electrolyte material, e.g., using an etch-back process with no photoresist. After this etch is completed, the electrode 132 and electrolyte region 130 form ring-shaped "spacers" on the sidewall 114 of the bottom electrode 120 and hard mask 112. As shown in FIG. 7C, a thick metal layer 180 (e.g., aluminum) can then be deposited as the final wiring on the wafer directly after the formation of the cell structure. In some embodiments, this is a via-less process and thus may decrease the cost of the process. In the illustrated example, metal layer region 180A may provide a top electrode contact for the illustrated memory cell, while metal layer region 180B may provide a peripheral routing contact or pad contact, as known in the art.

Figure 8A:
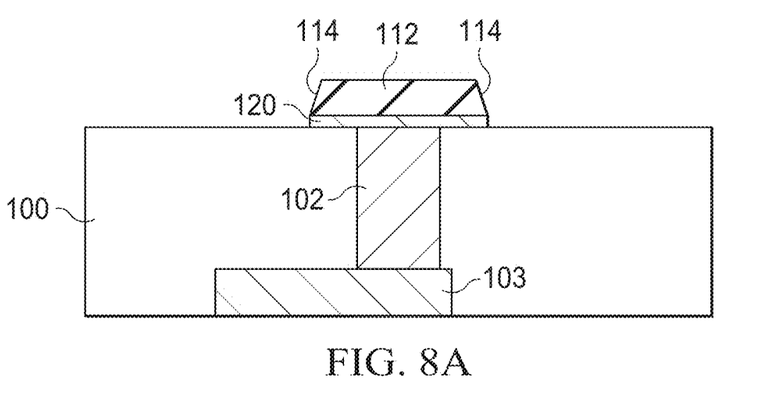
FIGS. 8A-8C illustrate an example method of forming a memory cell according to concepts disclosed herein, e.g., corresponding to FIGS. 4A-4D and FIGS. 6A-6C, according to one embodiment.
Figure 8B:
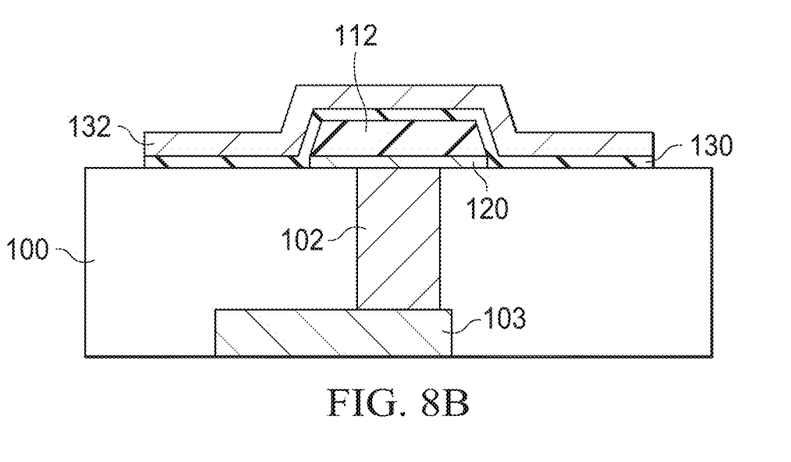
Figure 8C:
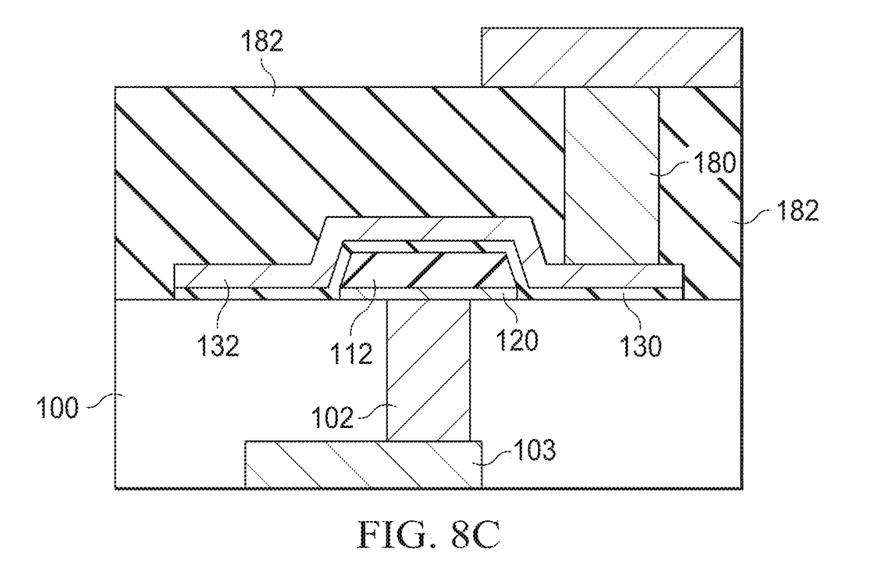

FIGS. 8A-8C illustrate an example method of forming a memory cell according to concepts disclosed herein, e.g., corresponding to FIGS. 4A-4D and FIGS. 6A-6C, according to one embodiment. FIG. 8A shows the deposition/formation of a bottom electrode connection 102, a conductive bottom path (e.g., to a transistor or other controlling device), and a bottom electrode 120, FIG. 8B shows the deposition/formation of an electrolyte film 130 and top electrode layer 132, and FIG. 8C shows the formation of a top electrode connection 180 in an insulator or dielectric layer (e.g., $SiO_2$) 182.

Figure 9A:
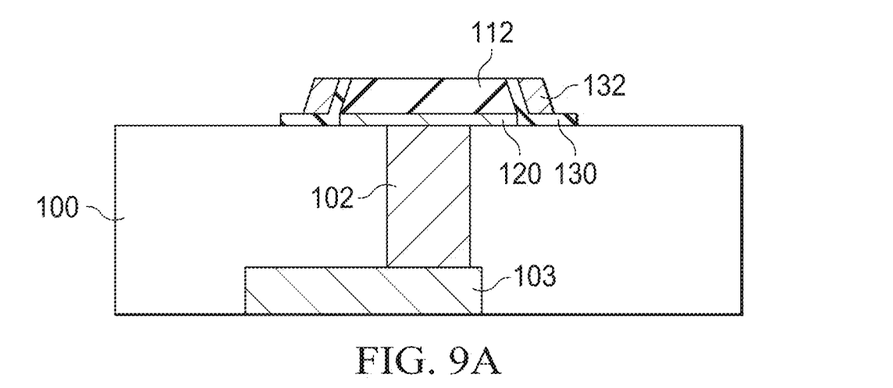
FIGS. 9A and 9B show a cross-sectional side view and side view, respectively, of an alternative to the technique shown in FIG. 8B, according to one embodiment.
Figure 9B:
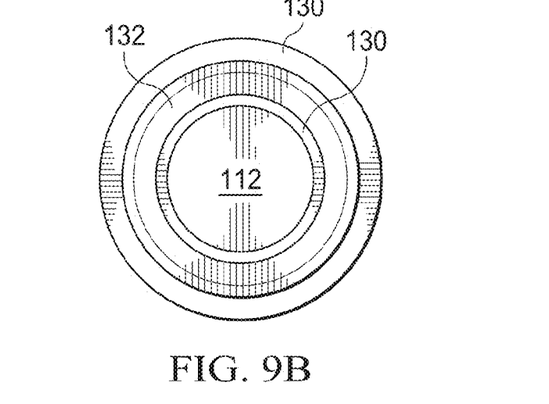

FIGS. 9A and 9B show a cross-sectional side view and side view, respectively, of an alternative to the technique shown in FIG. 8B, in which the top electrode 132 and electrolyte 130 are etched using an etch-back process with no photoresist, such that the top electrode 132 and electrolyte 130 form "spacers" on the sidewall 114 of the bottom electrode 120 and hard mask 112, e.g., corresponding to FIGS. 7A-7C.

Figure 10A:
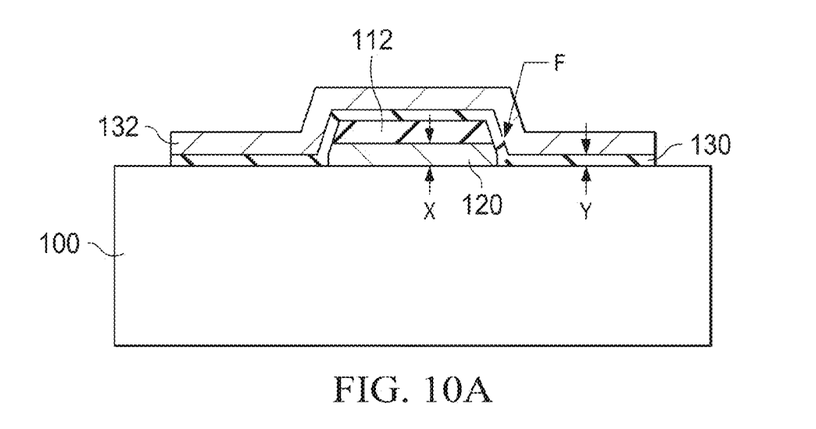
FIGS. 10A and 10B show the conductive path confinement provided by example sidewall cells as disclosed herein.
Figure 10B:
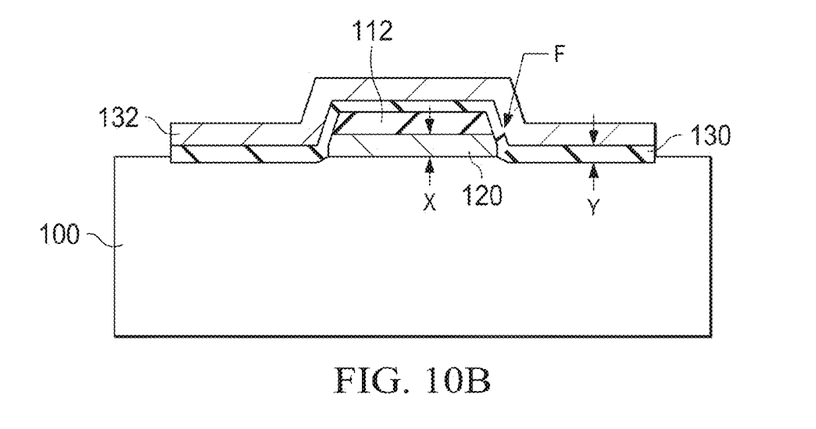

FIGS. 10A and 10B show the conductive path confinement provided by example sidewall cells as disclosed herein, and indicating example filaments F formed in the respective conductive paths. As shown in the example structure of FIG. 10A, the conductive path region depends on the difference (delta) between the bottom electrode 120 thickness (x) and the electrolyte 130 thickness (y), e.g., as discussed above regarding FIG. 5. FIG. 10B shows an embodiment in which a trench is formed into the substrate 100 during deposition of the electrolyte 130 and top electrode 132. In this embodiment, the conductive path region may depend only on the thickness (x) of the bottom electrode layer 120.

Various embodiments may provide one or more advantages relative to certain conventional structures and/or manufacturing techniques for conventional non-volatile memory cells. For example, some embodiments create a confined region for conductive path formation which will lead to a more robust conductive path with higher retention. Some embodiments provide that the conductive path formation region is outside of seams in the bottom electrode via. In some embodiments, the smaller electrode/conductive path formation area may allow for higher current densities to allow for unipolar cell switching (Vset and Vreset of same polarity). Some embodiments provide ultra thin electrodes for advanced processes with existing tools. Further, any of the structures and processes discussed herein may be applicable to a variety of memory cell types, for example CBRAM, ReRAM, PCM, and other advanced technologies. In some embodiments the manufacturing process involves fewer masks and/or fewer processing steps for a fundamentally cheaper flow, as compared with a manufacturing process for conventional cell structures.

The invention claimed is:

1. A cell for a resistive memory, comprising:
   a bottom electrode;
   a top electrode layer defining a sidewall; and
   an electrolyte layer arranged between the bottom and top electrode layers, such that a conductive path is defined between the bottom electrode and the top electrode sidewall via the electrolyte layer; and
   wherein the bottom electrode layer extends generally horizontally with respect to a horizontal substrate, and the top electrode sidewall extends non-horizontally with respect to the horizontal substrate, wherein the top electrode sidewall defines a ring shape extending around an outer perimeter of the bottom electrode.

2. The cell according to claim 1, wherein the bottom electrode has the shape of a flat circular electrode disk.

3. The cell according to claim 1, wherein the top electrode layer comprises a covering portion extending over and parallel to the bottom electrode.

4. The cell according to claim 1, wherein the electrolyte layer comprises a sidewall extending non-horizontally with respect to the horizontal substrate, and wherein the conductive path is defined through the electrolyte sidewall.

5. The cell according to claim 4, wherein the electrolyte layer sidewall extends parallel to the non-horizontal top electrode sidewall.

6. The cell according to claim 5, wherein the electrolyte layer sidewall defines a ring extending radially inside the top electrode layer.

7. The cell according to claim 1, wherein the top electrode sidewall extends at an angle relative to the horizontal substrate, the angle being between 30 and 90 degrees (non-inclusive).

8. The cell according to claim 1, wherein the top electrode sidewall extends at an angle relative to the horizontal substrate, the angle being between 60 and 90 degrees (non-inclusive).

9. The cell according to claim 1, wherein the top electrode sidewall extends at an angle relative to the horizontal substrate, the angle being between 45 and 85 degrees (non-inclusive).

10. The cell according to claim 1, wherein the top electrode sidewall extends perpendicular relative to the horizontal substrate.

11. The cell according to claim 1, wherein:
    the bottom electrode layer is formed on a substrate layer and has a bottom electrode layer thickness, and
    the top electrode layer is spaced apart from the substrate layer by a distance less than the bottom electrode thickness.

12. The cell according to claim 11, wherein the top electrode layer is spaced apart from the substrate layer by a portion of the electrolyte layer.

13. The cell according to claim 1, wherein the cell is configured such that when a positive bias-voltage is applied to the cell, a conductive path grows in a non-vertical direction between the bottom electrode and the top electrode sidewall.

14. The cell according to claim 1, wherein the cell is configured such that when a positive bias-voltage is applied to the cell, a conductive path grows in a generally horizontal between the bottom electrode and the top electrode sidewall.

15. A method of forming a sidewall-type resistive memory cell, the method comprising:
    depositing a bottom electrode layer over a horizontally extending substrate;
    forming a mask layer over the bottom electrode layer;
    patterning the bottom electrode layer and the mask layer to define a bottom electrode and mask region;
    depositing an electrolyte layer;
    forming a top electrode such that a sidewall of the top electrode extends non-horizontally with respect to the horizontal substrate, with the electrolyte layer arranged between the bottom electrode and the top electrode layer sidewall; and
    forming the top electrode such that the top electrode sidewall defines a ring shape extending around an outer perimeter of the bottom electrode.

16. The method according to claim 15, wherein the bottom electrode has the shape of a flat circular electrode disk.

17. The method according to claim 15, wherein the top electrode sidewall extends at an angle relative to the horizontal substrate, the angle being between 30 and 90 degrees (non-inclusive).

18. The method according to claim 15, wherein the top electrode sidewall extends at an angle relative to the horizontal substrate, the angle being between 60 and 90 degrees (non-inclusive).

19. The method according to claim 15, wherein the top electrode sidewall extends at an angle relative to the horizontal substrate, the angle being between 45 and 85 degrees (non-inclusive).

20. The method according to claim 15, wherein the top electrode sidewall extends perpendicular relative to the horizontal substrate.

21. The method according to claim 15, comprising:
   forming the bottom electrode with a bottom electrode layer thickness, and
   forming the top electrode such that the top electrode is spaced apart from the horizontally extending substrate by a distance less than the bottom electrode thickness.

22. The method according to claim 21, wherein the top electrode layer is spaced apart from the substrate layer by a portion of the electrolyte layer.

23. The method according to claim 15, further comprising applying a positive bias-voltage is applied to the cell such that a conductive path grows in a non-vertical direction between the bottom electrode and the top electrode sidewall.

24. The method according to claim 15, further comprising applying a positive bias-voltage is applied to the cell such that a conductive path grows in a generally horizontal direction between the bottom electrode and the top electrode sidewall.

* * * * *

UNITED STATES PATENT AND TRADEMARK OFFICE
CERTIFICATE OF CORRECTION

PATENT NO.        : 9,444,040 B2
APPLICATION NO.   : 14/183831
DATED             : September 13, 2016
INVENTOR(S)       : Justin Hiroki Sato et al.

Page 1 of 1

It is certified that error appears in the above-identified patent and that said Letters Patent is hereby corrected as shown below:

On the Title Page, Item (54) and in the Specification, Column 1, Title "...SIDEWALL TYPE MEMORY CELL..." ---Change to--- "...SIDEWALL-TYPE MEMORY CELL..."

Signed and Sealed this
Eighth Day of November, 2016

Michelle K. Lee
*Director of the United States Patent and Trademark Office*